(12) United States Patent
Matsushima

(10) Patent No.: US 9,698,347 B2
(45) Date of Patent: Jul. 4, 2017

(54) ORGANIC EL DISPLAY PANEL AND METHOD FOR MANUFACTURING SAME

(71) Applicant: JOLED INC., Tokyo (JP)

(72) Inventor: Hideaki Matsushima, Hyogo (JP)

(73) Assignee: JOLED INC., Tokyo (JP)

( * ) Notice: Subject to any disclaimer, the term of this patent is extended or adjusted under 35 U.S.C. 154(b) by 0 days.

(21) Appl. No.: 14/411,708

(22) PCT Filed: Aug. 1, 2013

(86) PCT No.: PCT/JP2013/004676
§ 371 (c)(1),
(2) Date: Dec. 29, 2014

(87) PCT Pub. No.: WO2014/020914
PCT Pub. Date: Feb. 6, 2014

(65) Prior Publication Data
US 2015/0171327 A1 Jun. 18, 2015

(30) Foreign Application Priority Data
Aug. 2, 2012 (JP) .................................. 2012-172179

(51) Int. Cl.
*H01L 29/08* (2006.01)
*H01L 35/24* (2006.01)
(Continued)

(52) U.S. Cl.
CPC ...... *H01L 51/0005* (2013.01); *H01L 27/3218* (2013.01); *H01L 27/3246* (2013.01); *H01L 51/56* (2013.01)

(58) Field of Classification Search
CPC ............. H01L 27/3246; H01L 27/3211; H01L 27/3283; H01L 51/0005; H01L 27/3276;
(Continued)

(56) References Cited

U.S. PATENT DOCUMENTS 6,559,910 B2 * 5/2003 Suzuki ............. G02F 1/133526
349/66
8,203,158 B2 6/2012 Yoshida et al.
(Continued)

FOREIGN PATENT DOCUMENTS

JP 11-87062 3/1999
JP 2004-095290 3/2004
(Continued)

OTHER PUBLICATIONS

U.S. Appl. No. 14/402,338 to Tsuyoshi Yamamoto, filed Nov. 20, 2014.
(Continued)

*Primary Examiner* — Thao X Le
*Assistant Examiner* — Nduka Ojeh
(74) *Attorney, Agent, or Firm* — Greenblum & Bernstein, P.L.C.

(57) ABSTRACT

An organic EL display panel includes a substrate and a bank layer on the substrate. The bank layer defines a first sub-pixel region and a second sub-pixel region that have elongated shapes and different light-emission colors from each other. The bank layer has a plurality of concave portions. When an imaginary line J is drawn in a lateral direction (X direction) from a center point in a longitudinal direction (Y direction) of the first sub-pixel region, an intersection point out of two intersection points where the imaginary line and an edge of the first sub-pixel region intersect is defined as a reference point. A minimum distance between the reference point and an edge of one of the concave portions closest to the reference point is shorter than a minimum distance between the reference point and an edge of the second sub-pixel region closest to the reference point.

15 Claims, 12 Drawing Sheets

(51) Int. Cl.
*H01L 51/00* (2006.01)
*H01L 27/32* (2006.01)
*H01L 51/56* (2006.01)

(58) Field of Classification Search
CPC ............. H01L 51/0004; H01L 51/5203; H01L 51/5206; H01L 51/5221; H01L 51/5262; H01L 51/56; H01L 27/3218; H01L 51/022; H01L 27/3295
USPC ............. 257/98, E21.001, E21.002, E33.001, 257/E51.018, E51.021, 40, 89; 438/23, 438/29, 34
See application file for complete search history.

(56) References Cited

U.S. PATENT DOCUMENTS

| | | | |
|---|---|---|---|
| 8,778,712 B2 | 7/2014 | Takeuchi | |
| 8,901,546 B2 | 12/2014 | Matsushima | |
| 8,907,358 B2 | 12/2014 | Matsushima | |
| 8,952,365 B2 | 2/2015 | Nishiyama | |
| 2002/0167268 A1* | 11/2002 | Aruga et al. | 313/500 |
| 2004/0056588 A1 | 3/2004 | Nozawa | |
| 2005/0231447 A1 | 10/2005 | Hu et al. | |
| 2007/0238406 A1* | 10/2007 | Jeong | B60H 1/00849 454/139 |
| 2007/0284585 A1* | 12/2007 | Cho | H01L 27/3274 257/72 |
| 2010/0213827 A1* | 8/2010 | Yoshida et al. | 313/504 |
| 2011/0121282 A1 | 5/2011 | Rokuhara et al. | |
| 2012/0040478 A1* | 2/2012 | Takeuchi | H01L 27/3246 438/23 |
| 2012/0181525 A1* | 7/2012 | Sugimoto | H01L 27/3246 257/40 |
| 2013/0099221 A1 | 4/2013 | Kawamura et al. | |
| 2013/0134449 A1* | 5/2013 | Chen | H01L 27/3279 257/88 |
| 2013/0256648 A1 | 10/2013 | Nakatani | |
| 2014/0151709 A1 | 6/2014 | Nishiyama et al. | |

FOREIGN PATENT DOCUMENTS

| | | |
|---|---|---|
| JP | 2004-117689 | 4/2004 |
| JP | 2005-316467 | 11/2005 |
| JP | 2005-345766 | 12/2005 |
| JP | 2006-228648 | 8/2006 |
| JP | 2009-272276 | 11/2009 |
| JP | 2010-009753 | 1/2010 |
| JP | 2010-033931 | 2/2010 |
| JP | 2011-170981 | 9/2011 |
| WO | 2012/017498 | 2/2012 |
| WO | 2012/086111 | 6/2012 |

OTHER PUBLICATIONS

International Search Report (ISR) in International Patent Application No. PCT/JP2013/004676, dated Nov. 5, 2013.

* cited by examiner

ORGANIC EL DISPLAY PANEL AND METHOD FOR MANUFACTURING SAME

TECHNICAL FIELD

The present invention is related to organic EL display panels formed by a process including forming a light-emitting layer by a printing method such as an inkjet method, and methods of manufacturing such organic EL display panels.

BACKGROUND ART

In recent years, research and development related to organic electroluminescence elements (hereafter, "organic EL elements") has been advancing. Organic EL elements are current-driven light-emitting elements that use electroluminescence of organic light-emitting materials. Organic EL display panels in which organic EL elements are arranged on a substrate are widely used as display devices using organic EL elements. An organic EL element in an organic EL display panel may, for example, be composed of a thin-film transistor (TFT) substrate, an anode composed of metal such as Al, a light-emitting layer composed of organic light-emitting material, and a cathode composed of light-transmissive material such as indium tin oxide (ITO), layered in the stated order. Further, such an organic EL element may include, as required, a hole injection layer, a hole transport layer, an electron injection layer, an electron transport layer, a sealing layer, etc.

Among methods for manufacturing a light-emitting layer in an organic EL display panel are a method of using vacuum deposition and a printing method of applying organic material ink containing trace amounts of organic light-emitting material dissolved in solution. A light-emitting layer can be formed by a simpler manufacturing apparatus when using such a printing method than when using a vacuum deposition method. Thus, there is an advantage that such a printing method can also be used when manufacturing a large organic EL display panel.

The following is a description of a conventional method of forming a light-emitting layer by a printing method using inkjets. First, a bank layer composed of material including a liquid-repellent component is formed on a substrate. Further, sub-pixel regions are formed as a plurality of openings in the bank layer. Further, organic material ink is applied into each sub-pixel region, and by drying the organic material ink light-emitting layers are formed within each sub-pixel region (see Patent Literature 1). Light-emission colors of adjacent light-emitting layers are different colors from among red (R), green (G), and blue (B). Further, material for the light-emitting layers is different for each light-emission color.

CITATION LIST

Patent Literature

[Patent Literature 1]
Japanese Patent Application Publication No. H11-87062

SUMMARY OF INVENTION

Technical Problem

In recent years, miniaturization of sub-pixel regions has been advancing in order to improve image quality of organic EL display panels. As a result of miniaturization of sub-pixel regions while maintaining aperture ratios, widths of banks in bank layers dividing adjacent sub-pixel regions are becoming narrower. When the widths of banks in a bank layer are narrow and organic material ink is applied to sub-pixel regions, the organic material ink may overflow and enter adjacent sub-pixel regions. Thus, there is a technical problem that mixing of colors occurs in adjacent light-emitting layers when organic material ink overflows when forming light-emitting layers of different light-emission colors for adjacent sub-pixels, causing image quality of such an organic EL display panel to degrade.

The present invention is achieved in view of the above technical problem, and has an aim of providing an organic EL display panel in which, even when organic material ink overflows from a sub-pixel region, occurrence of the organic material ink entering adjacent sub-pixel regions is suppressed.

Solution to Problem

The organic EL display panel pertaining to an aspect of the present invention comprises a substrate and a bank layer on the substrate, the bank layer defining a first sub-pixel region that has an elongated shape and a second sub-pixel region that has an elongated shape and a light-emission color different from a light-emission color of the first sub-pixel region, the bank layer having an upper portion in which a plurality of concave portions are provided, wherein, in a plan view of the substrate, the second sub-pixel region is adjacent to the first sub-pixel region in a direction other than a longitudinal direction of the first sub-pixel region, and when an imaginary line is drawn in a lateral direction from a center point in a longitudinal direction of the first sub-pixel region, and when, of two intersection points where the imaginary line and an edge of the first sub-pixel region intersect, an intersection point closest to one of the concave portions provided in the bank layer is defined as a reference point, a minimum distance between the reference point and an edge of said one of the concave portions closest to the reference point is shorter than a minimum distance between the reference point and an edge of the second sub-pixel region closest to the reference point.

Advantageous Effects of Invention

In the organic EL display panel pertaining to the aspect of the present invention, the minimum distance between the reference point and the edge of said one of the concave portions is shorter than the minimum distance between the reference point and the edge of the second sub-pixel region. In this way, when the reference point is a location at which organic material ink most easily overflows, for example, organic material ink that overflows from the reference point arrives at the concave portion before arriving at the second sub-pixel region. Accordingly, even when the organic material ink overflows from a sub-pixel region, entry of the organic material ink into adjacent sub-pixel regions is suppressed.

BRIEF DESCRIPTION OF DRAWINGS

FIG. 5A illustrates a process of preparing a substrate on which an anode and a hole injection layer are formed; FIG. 5B illustrates a process of forming a bank material layer; and FIG. 5C illustrates a process of arranging a mask.

FIG. 6A illustrates a process of forming a bank layer; FIG. 6B illustrates a process of forming light-emitting layers; and FIG. 6C illustrates a process of forming an electron injection layer, a cathode, and a sealing layer.

FIG. 7A illustrates a state immediately after application of the organic material ink; FIG. 7B illustrates a state during drying of the organic material ink; and FIG. 7C illustrates a state after forming a light-emitting layer.

FIG. 7A illustrates a state immediately after application of the organic material ink; FIG. 7B illustrates a state during drying of the organic material ink; and FIG. 7C illustrates a state after forming a light-emitting layer.

DESCRIPTION OF EMBODIMENTS

Figure 1:
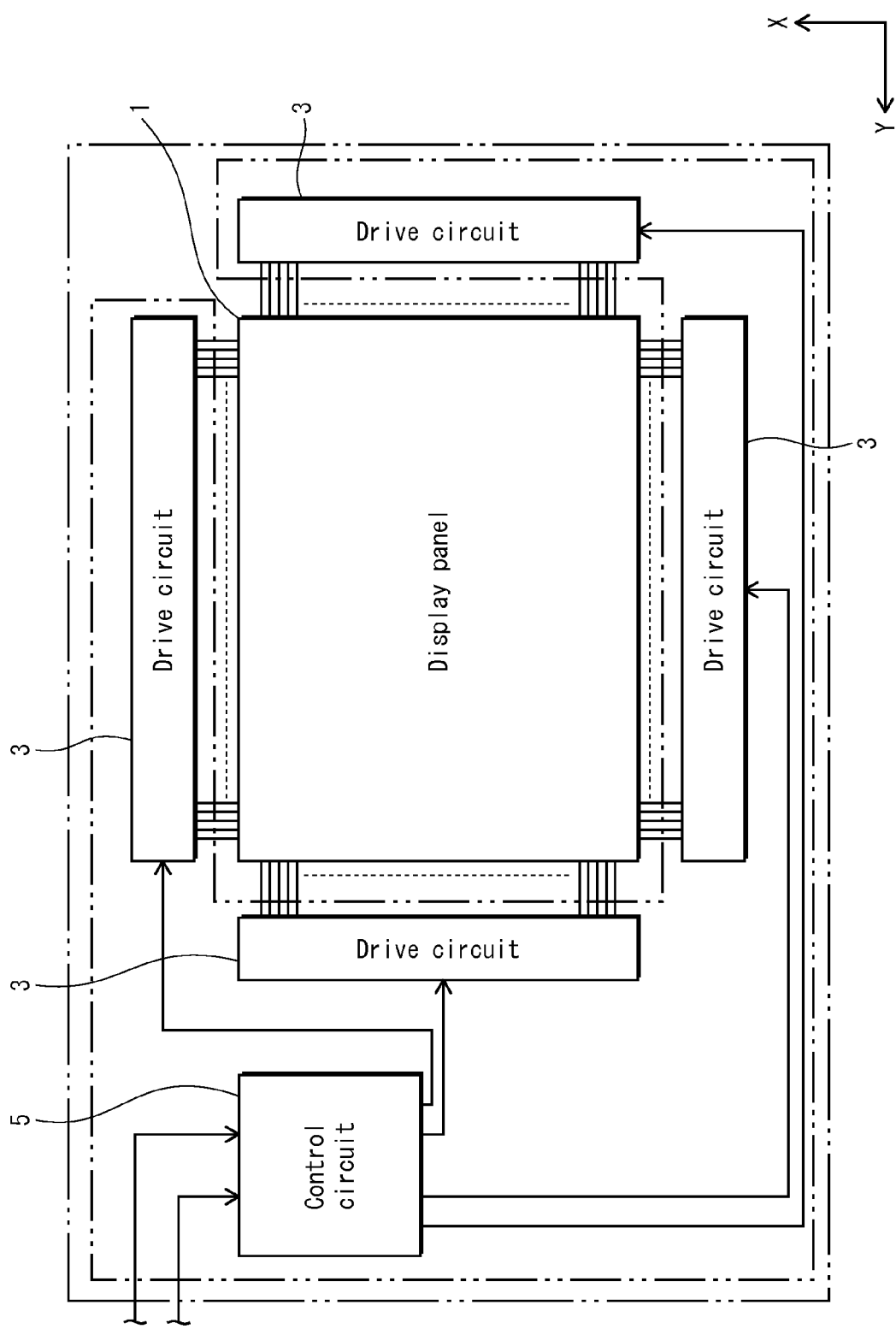
FIG. 1 is a schematic block diagram illustrating a general configuration of an organic EL display panel pertaining to an embodiment of the present invention.

[Developments that Led to One Aspect of the Present Invention]

Prior to describing an aspect of the present invention in detail, the following is a description of developments that led to the aspect of the present invention.

Conventionally, a technical problem when applying organic material ink to a sub-pixel region is that the organic material ink may overflow from the sub-pixel region and enter an adjacent sub-pixel region. Thus, the inventors considered the mechanism by which the organic material ink overflows from the sub-pixel region. As a result, it became clear that, when banks of a bank layer are of uniform width, the organic material ink easily overflows from a central portion of an edge of the sub-pixel region. It also became clear that, when the banks of the bank layer are not of uniform width, the organic material ink overflows from a narrower portion of the banks and easily enters adjacent sub-pixel regions.

The inventors focused on this point, and provided the bank layer with concave portions. Specifically, the sub-pixel regions and the concave portions are arranged such that, when the organic material ink overflows from an edge of a sub-pixel region, a minimum distance between an ink outflow portion at which the organic material ink easily overflows to an adjacent sub-pixel region and an edge of an opening of a concave portion provided in the bank layer is less than a minimum distance between the ink outflow portion and an edge of the adjacent sub-pixel region. In this way, a result is obtained of suppressing entry of the organic material ink into the adjacent sub-pixel region even when the organic material ink overflows from the sub-region pixel. The aspect of the present invention was derived from such developments.

[Overview of Aspects of the Present Invention]

The organic EL display panel pertaining to an aspect of the present invention comprises a substrate and a bank layer on the substrate, the bank layer defining a first sub-pixel region that has an elongated shape and a second sub-pixel region that has an elongated shape and a light-emission color different from a light-emission color of the first sub-pixel region, the bank layer having an upper portion in which a plurality of concave portions are provided, wherein, in a plan view of the substrate, the second sub-pixel region is adjacent to the first sub-pixel region in a direction other than a longitudinal direction of the first sub-pixel region, and when an imaginary line is drawn in a lateral direction from a center point in a longitudinal direction of the first sub-pixel region, and when, of two intersection points where the imaginary line and an edge of the first sub-pixel region intersect, an intersection point closest to one of the concave portions provided in the bank layer is defined as a reference point, a minimum distance between the reference point and an edge of said one of the concave portions closest to the reference point is shorter than a minimum distance between the reference point and an edge of the second sub-pixel region closest to the reference point.

In this way, even when the organic material ink overflows from a sub-pixel region, entry of the organic material ink into adjacent sub-pixel regions is suppressed.

Further, a longitudinal direction of the second sub-pixel region may be a direction parallel to the longitudinal direction of the first sub-pixel direction, and a center point in the longitudinal direction of the first sub-pixel region and a center point in the longitudinal direction of the second sub-pixel region may be located so as not to be on the same straight line in a lateral direction of the first sub-pixel region.

Further, the bank layer may further define a third sub-pixel region opposite the second sub-pixel region relative to the first sub-pixel region, the third sub-pixel region having an elongated shape and having a light-emission color different from the light-emission color of the first sub-pixel region and the light-emission color of the second sub-pixel region, a longitudinal direction of the third sub-pixel region may be a direction parallel to the longitudinal direction of the first sub-pixel direction and the third sub-pixel region may be adjacent to the first sub-pixel region in a direction other than the longitudinal direction of the first sub-pixel region, and in the plan view of the substrate, a distance between a second intersection point of the two intersection points that is not the reference point and an edge of a concave portion closest to the second intersection point may be shorter than a distance between the second intersection point and an edge of the third sub-pixel region closest to the second intersection point.

Further, an organic layer may be formed by applying and drying an ink containing organic material into the first sub-pixel region, the second sub-pixel region, and the third sub-pixel region.

Further, the organic layer may be an organic light-emitting layer.

Further, an end portion of an edge of the second sub-pixel region and an end portion of an edge of the third sub-pixel region may be on the imaginary line.

Further, the concave portions may be in regions of contact holes that allow electrical connection between light-emitting portions and a drive element for driving the light-emitting portions in the first sub-pixel region and the second sub-pixel region.

A method of manufacturing the organic EL display panel of the present invention may comprise: a first sub-pixel region having a surface shape; a second sub-pixel adjacent to the first sub-pixel region in a direction other than a longitudinal direction of the first sub-pixel region and having a light-emission color different to a light-emission color of the first sub-pixel region; and a bank layer in which concave portions are provided other than the first sub-pixel region and the second sub-pixel region, wherein an edge of the first sub-pixel region includes an ink outflow portion, and a minimum distance between the ink outflow portion and an edge of one of the concave portions closest to the ink outflow portion is shorter than a minimum distance between the ink outflow portion and the second sub-pixel region.

A method of manufacturing the organic EL display panel of the present invention comprises: a first sub-pixel region having an elongated shape; a second sub-pixel region having an elongated shape, the second sub-pixel region being adjacent to the first sub-pixel region in a direction other than a longitudinal direction of the first sub-pixel region and having a light-emission color different to a light-emission color of the first sub-pixel region; and a bank layer in which concave portions are provided other than the first sub-pixel region and the second sub-pixel region, wherein, in a plan view of the substrate, an edge of the first sub-pixel region includes an ink outflow portion, and a minimum distance between the ink outflow portion and an edge of one of the concave portions closest to the ink outflow portion is shorter than a minimum distance between the ink outflow portion and the second sub-pixel region.

Further, a method of manufacturing the organic EL display panel of the present invention may comprise: preparing a substrate; and forming a bank layer on the substrate, the bank layer defining a first sub-pixel region that has an elongated shape and a second sub-pixel region that has an elongated shape, the bank layer having an upper portion in which a concave portion is provided, wherein, in a plan view of the substrate, when an imaginary line is drawn in a lateral direction from a center point in a longitudinal direction of the first sub-pixel region, and when, of two intersection points where the imaginary line and an edge of the first sub-pixel region intersect, an intersection point closest to the concave portion is defined as a reference point, in forming the bank layer, the concave portion is formed such that a minimum distance between the reference point and an edge of the concave portion closest to the reference point is formed to be shorter than a minimum distance between the reference point and an edge of the second sub-pixel region closest to the reference point.

<Embodiment 1>
1. Overall Structure

Figure 2:
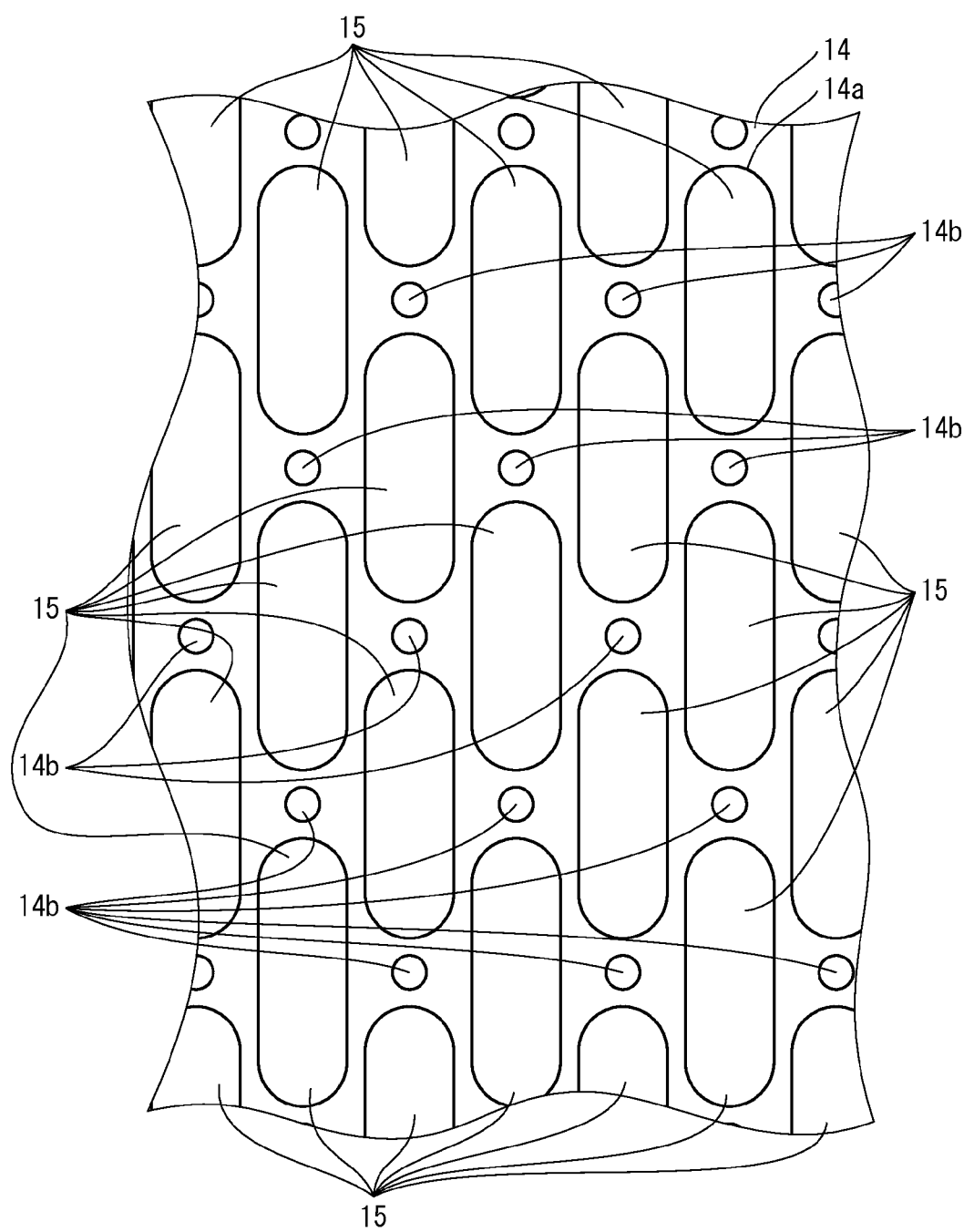
FIG. 2 is a plan view of the organic EL display panel illustrated in FIG. 1.
Figure 2:
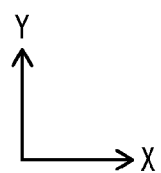

The following is a detailed description, with reference to FIGS. 1 and 2, of an embodiment of the present invention.

FIG. 1 is a schematic block diagram illustrating a general structure of a display device including an organic EL display panel 1 pertaining to embodiment 1 of the present invention. Note that the organic EL display panel 1 is a top-emission type of display panel in which light from the light-emitting layer is emitted from an opposite side to a glass substrate.

The organic EL display panel 1 is connected to drive circuits 3 and the drive circuits 3 are controlled by a control circuit 5. The organic EL display panel 1 is an organic EL panel using electroluminescence of an organic material, in which a plurality of organic EL elements are arranged. Note that an actual implementation of a display device is not limited to this arrangement of the drive circuits 3 and the control circuit 5.

FIG. 2 is a plan view of the organic EL display panel 1, in which a bank layer 14 and light-emitting layers 15 can be seen. Each region of the light-emitting layers 15 corresponds to a sub-pixel region. In a typical 20-inch organic EL display panel, when 1280 by 768 pixels are arranged a uniform distance apart from each other, each sub-pixel region is 64 μm by 234 μm.

The bank layer 14 surrounds sub-pixel regions 14a. In other words, the bank layer 14 defines sub-pixel regions. A shape of the opening of the sub-pixel regions 14a is an elongated shape, and as an example is here an ellipse. An elongated shape means a narrow and long shape when the organic EL display panel 1 viewed in plan view from a layering direction (from above). Further, the elongated shape may be, for example, a rhombus, a rectangle, etc.

Sub-pixel regions 14a that are adjacent and have the same light-emission color are adjacent to each other in a longitudinal direction (Y direction). Further, in the sub-pixel regions 14a that are adjacent and have the same light-emission color, center points of the sub-pixel regions 14a in the longitudinal direction (Y direction) are located on a straight line in a lateral direction (X direction). On the other hand, sub-pixel regions 14a that are adjacent and have different light-emission colors are adjacent to each other in directions other than the longitudinal direction (Y direction). Further, in the sub-pixel regions 14a that are adjacent and have different light-emission colors, center points of the sub-pixel regions 14a in the longitudinal direction (Y direction) are not located on a straight line in the lateral direction (X direction). Further, a line in the longitudinal direction of a given light-emission color of sub-pixel regions 14a and a line in the longitudinal direction of sub-pixel regions 14a having a different light-emission color are parallel. Concave portions 14b are formed in the bank layer 14.

Figure 3:
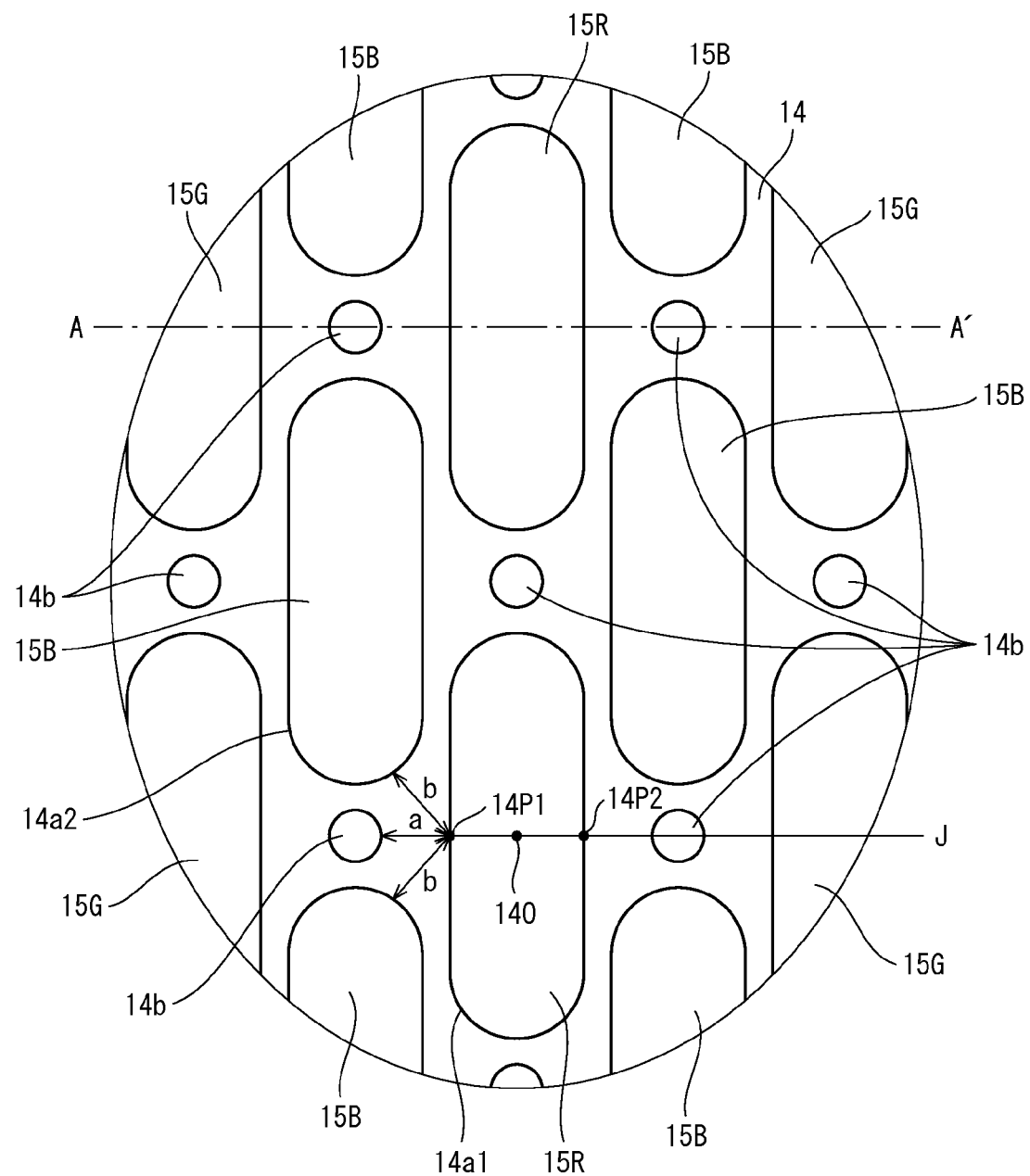
FIG. 3 is an enlarged view of the plan view of the organic EL display panel illustrated in FIG. 2.
Figure 3:
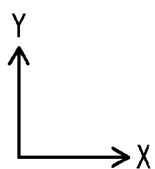

FIG. 3 is an enlargement of a portion of the plan view of the organic EL display panel 1. Adjacent sub-pixel regions, i.e., adjacent light-emitting layers 15, are arranged such that the light-emission colors of the adjacent light-emitting layers 15 are different.

When an imaginary line J is drawn in an X axis direction from a center 14O in a Y axis direction of a sub-pixel region 14a1, two intersection points 14P1 and 14P2 are where the imaginary line J and edges of the sub-pixel region 14a1 intersect, and an intersection point on a side close to a concave portion 14b1 is defined as a reference point 14P1. The sub-pixel region 14a1 and the concave portion 14b1 are arranged such that a minimum distance a between the reference point 14P1 and an edge of an opening of the concave portion 14b1 is shorter than a minimum distance b between the reference point 14P1 and an edge of a sub-pixel region 14a2 that is adjacent to the sub-pixel 14P1. In other words the first sub-pixel region 14a1 and the concave portion 14b1 are arranged such that the distance between the reference point 14P1 and the concave portion 14b1 is shorter than the distance between the reference point 14P1 and the second sub-pixel region 14a2.

Note that width of the banks in the bank layer 14 is uniform between adjacent sub-pixels 14a. When the organic material ink is applied to the sub-pixel region 14a1, the reference point 14P1 of the first sub-pixel region is the point at which the organic material ink is most likely to overflow. This is because when a spherical drop of the organic material ink is dropped into the sub-pixel region 14a1, a portion of the organic material ink that receives the greatest force from the bank layer 14 corresponds to the organic material ink located at the reference point 14P1 of the first sub-pixel region. Note that the reference point 14P1 of the first sub-pixel region is not only a location at which ink actually flows out, but is also a location at which ink does not actually flow out, but at which there is a risk of ink flowing out.

Figure 4:
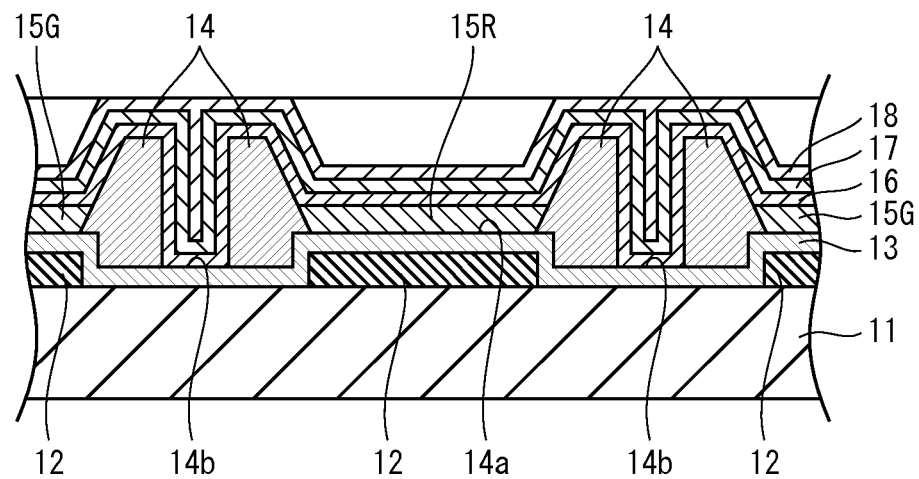
FIG. 4 is a cross-section of the organic EL display panel illustrated in FIG. 1.

The cross-section of FIG. 4 corresponds to a cross-section taken along A-A' in FIG. 3.

The organic EL display panel 1 includes a thin film transistor (TFT) substrate 11 including a glass substrate, a TFT layer, a planarizing layer, etc., and above the TFT substrate 11, a plurality of anodes 12, one for each sub-pixel region, a hole injection layer 13 covering the anodes 12, and a bank layer 14 formed on the hole injection layer 13. The thin-film transistor in the TFT substrate 11 is not illustrated in the cross-section. The concave portions 14b are formed in the bank layer 14. Banks in the bank layer 14 have a tapered shape in this cross-section.

Layered within a given sub-pixel region between adjacent banks of the bank layer 14, are an anode 12 composed of metal, the hole injection layer 13, and a light-emitting layer 15R, 15G, or 15B (hereafter, when a distinction is not required, "light-emitting layer 15") composed of organic material. Note that in this cross-section, the light-emitting layer 15B is not illustrated. Further, the organic EL display panel 1 includes an electron injection layer 16 covering the bank layer 14 and the light-emitting layer 15, a cathode 17 composed of light-transmissive material, and a sealing layer 18 composed of light-transmissive material. More specifically, the electron injection layer 16, the cathode 17, and the sealing layer 18 are layered in the stated order and enter into the concave portions 14b of the bank layer 14.

Material of the anodes 12 may be Al, for example. Material of the hole injection layer 13 may be a metal oxide, for example. As a material of the bank layer 14, a photosensitive resist material may be used such as acrylic resin, polyimide resin, Novalac-type phenolic resin, etc., which are organic materials having insulating properties. Further, a film thickness of the bank layer 14 is 1 μm. Material of the cathode 17 may be indium tin oxide (ITO), for example. Material of the sealing layer 18 may be silicon nitride (SiN), for example. Note that in the organic EL display panel 1, a combination of three sub-pixels, B, R, and G, comprise one pixel. Further, the difference between the B, R, and G light-emission colors of the sub-pixel regions is due to a difference in material of the light-emitting layers 15.

2. Method of Manufacturing the Organic EL Display Panel 1

Next is a description of a method of manufacturing the organic EL display panel using the cross-sections 5A, 5B, 5C, 6A, 6B, and 6C.

Figure 5A:
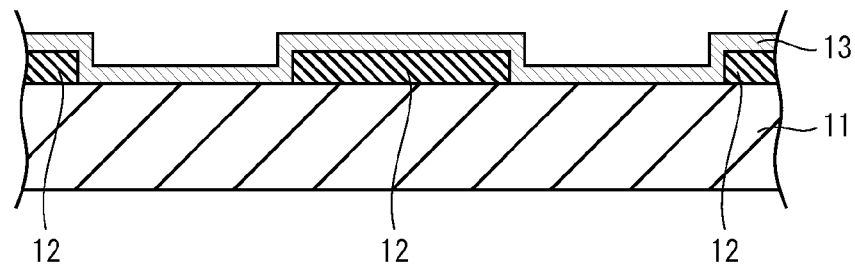
FIGS. 5A, 5B, and 5C are cross-sections illustrating a process of manufacturing the organic EL display panel illustrated in FIG. 1.

As illustrated in FIG. 5A, first, a substrate is prepared including a TFT substrate 11, an anode 12, and a hole injection layer 13. The anode 12 is formed, for example, by forming an Al layer on the TFT substrate using a sputtering process, then patterning the Al layer using a photolithography process. The hole injection layer 13 is formed, for example, by forming a metal layer on the anode 12 using a sputtering process, then oxidizing the metal layer.

Figure 5B:
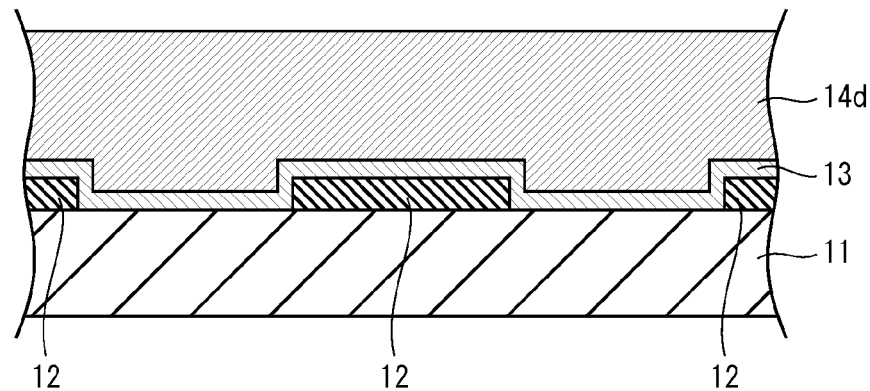

As illustrated in FIG. 5B, a bank material layer 14d is formed covering the hole injection layer 13. Specifically, the bank material layer 14d is formed using a method such as spin-coating.

Figure 5C:
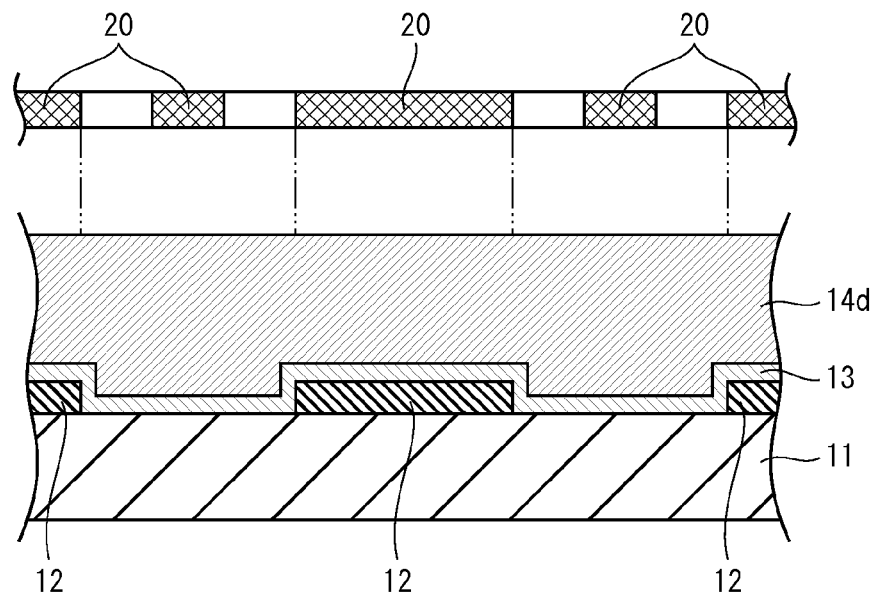
Figure 6A:
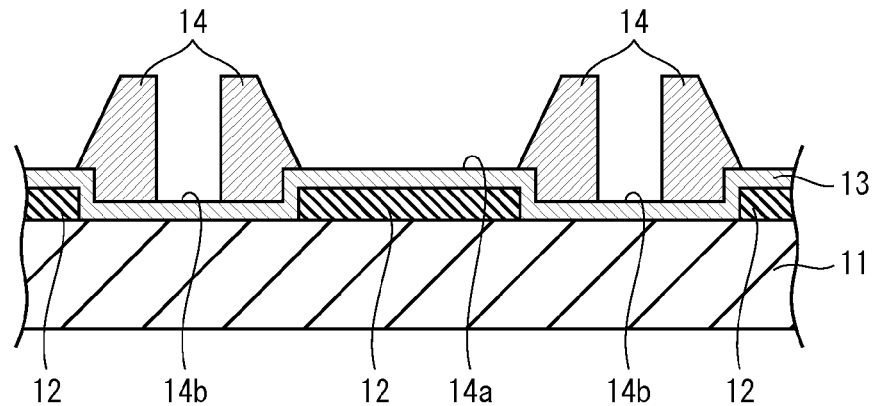
FIGS. 6A, 6B, and 6C are cross-sections illustrating a process of manufacturing the organic EL display panel illustrated in FIG. 1.

As illustrated in FIG. 5C, a mask 20 is arranged above the bank material layer 14d. The mask 20 has openings at locations where the bank layer 14 is to be formed. In this state, lithographic exposure is executed through the openings of the mask 20. In this way, as illustrated in FIG. 6A, the bank layer 14 is formed having the sub-pixel regions 14a and the concave portions 14b.

Figure 6B:
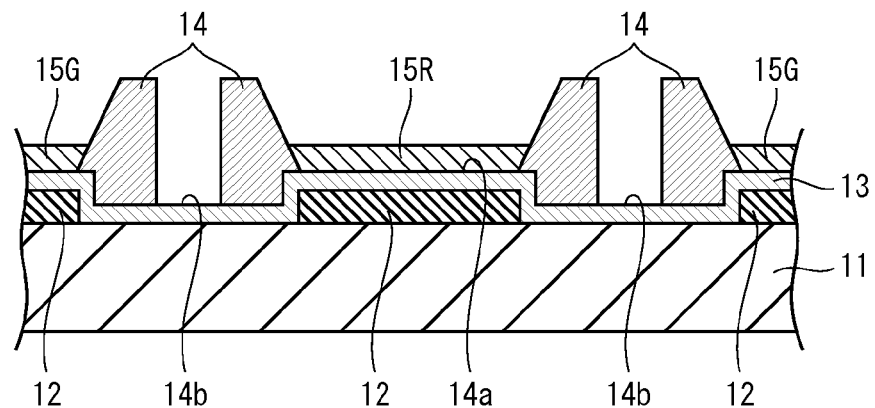

As illustrated in FIG. 6B, the light-emitting layers 15 are formed in B, R, and G sub-pixel regions surrounded by the bank layer 14. Specifically, in a printing method using inkjets, the light-emitting layers 15 are formed by, after applying the organic material ink that is material of the light-emitting layers 15 and performing natural drying, performing forced drying such as vacuum drying or baking. At this time, a surface tension of the organic material ink is, for example, 30 mN/m. Solvent of the organic material ink is, for example, toluene, and solid content concentration of the organic material ink is, for example, 0.2 wt %.

Figure 6C:
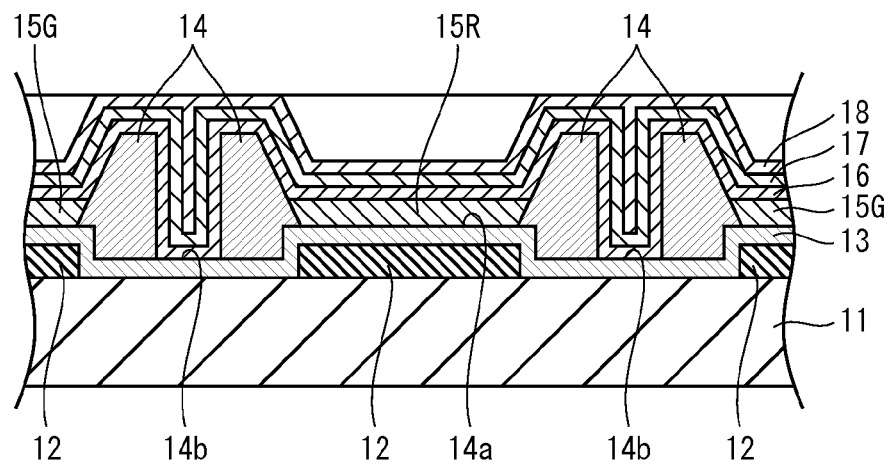

As illustrated in FIG. 6C, the electron injection layer 16, the cathode 17, and the sealing layer 18 are formed covering the bank layer 14 and the light-emitting layer 15. Note that the electron injection layer 16, the cathode 17, and the sealing layer 18 use typical materials and formation techniques used in known organic light-emitting device technologies.

The organic EL display panel 1 is manufactured by the above processes.

3. Effects

Figure 7A:
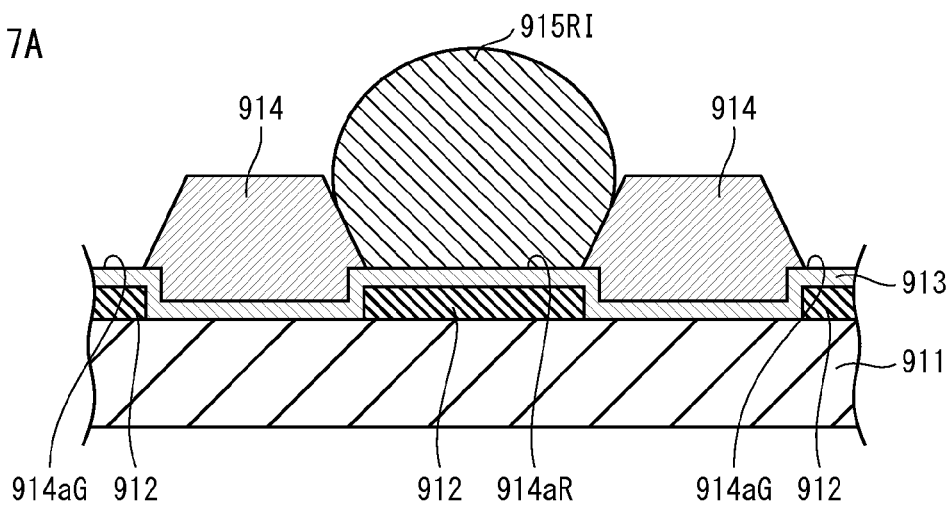
FIGS. 7A, 7B, and 7C are schematic cross-section diagrams for describing a case in which organic material ink overflows during a process of manufacturing a conventional organic EL display panel.
Figure 7B:
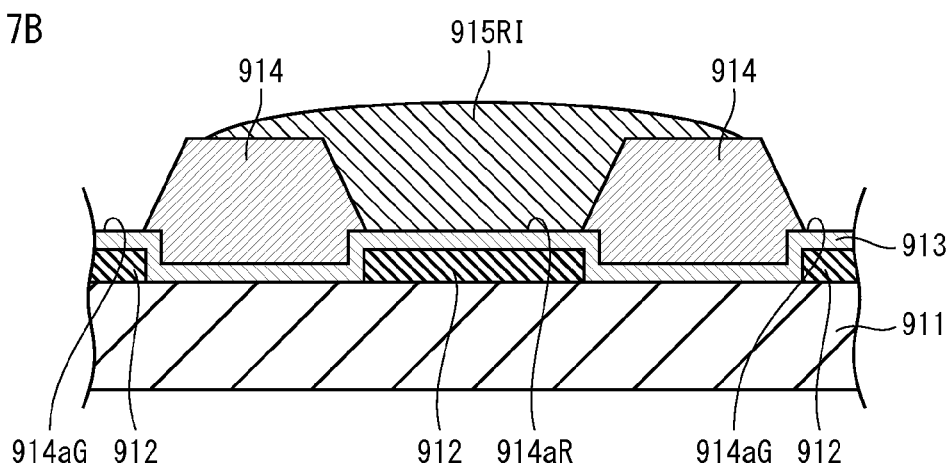
Figure 7C:
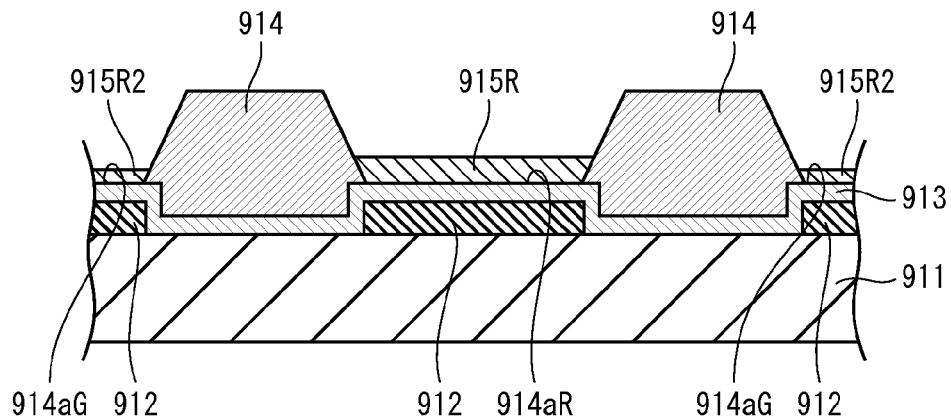
Figure 8:
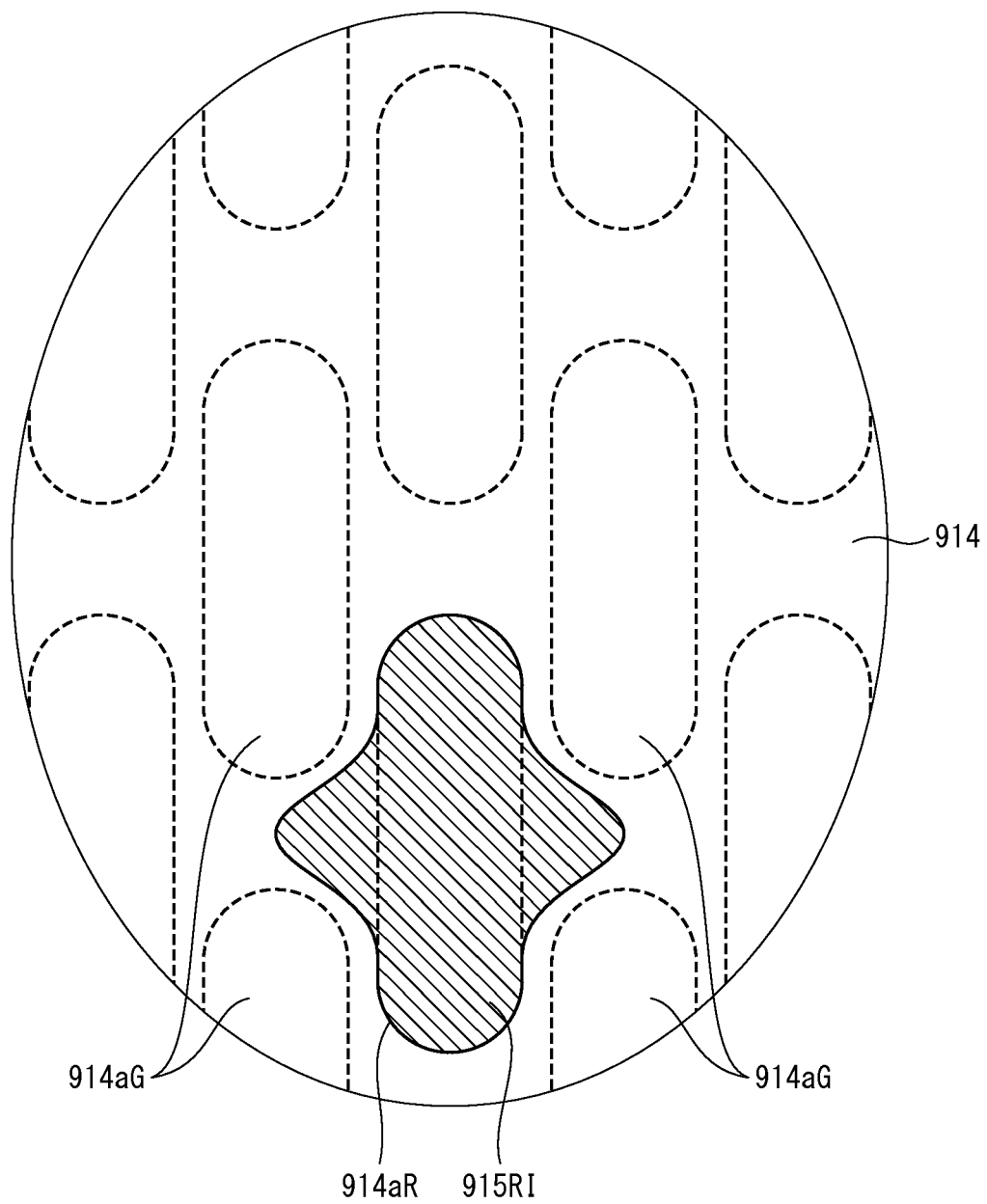
FIG. 8 is a schematic plan view diagram for describing a case in which organic material ink overflows during a process of manufacturing a conventional organic EL display panel.
Figure 9A:
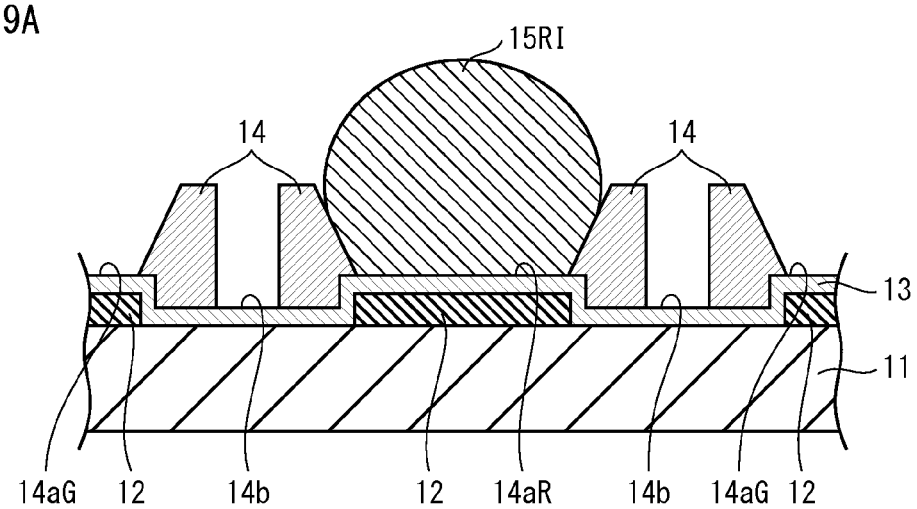
FIGS. 9A, 9B, and 9C are schematic cross-section diagrams for describing a case in which organic material ink overflows during a process of manufacturing the organic EL display panel illustrated in FIG. 1.
Figure 9B:
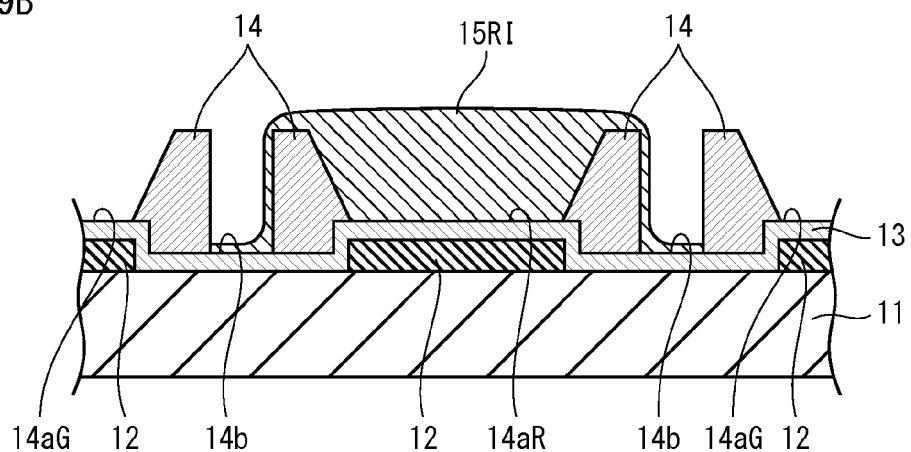
Figure 9C:
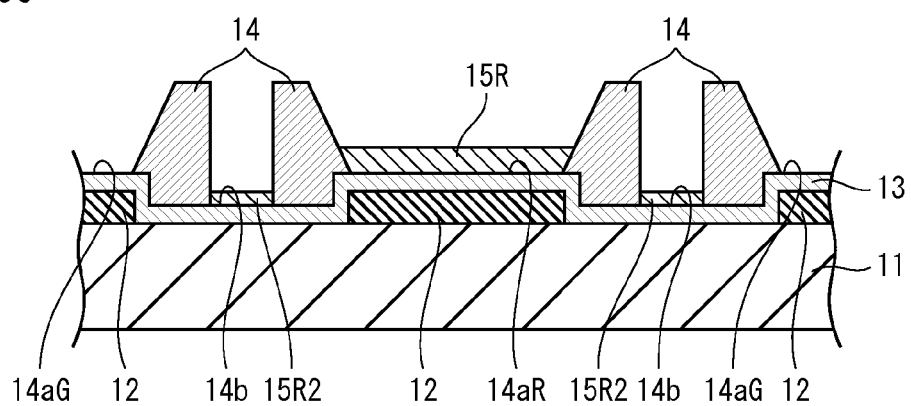
Figure 10:
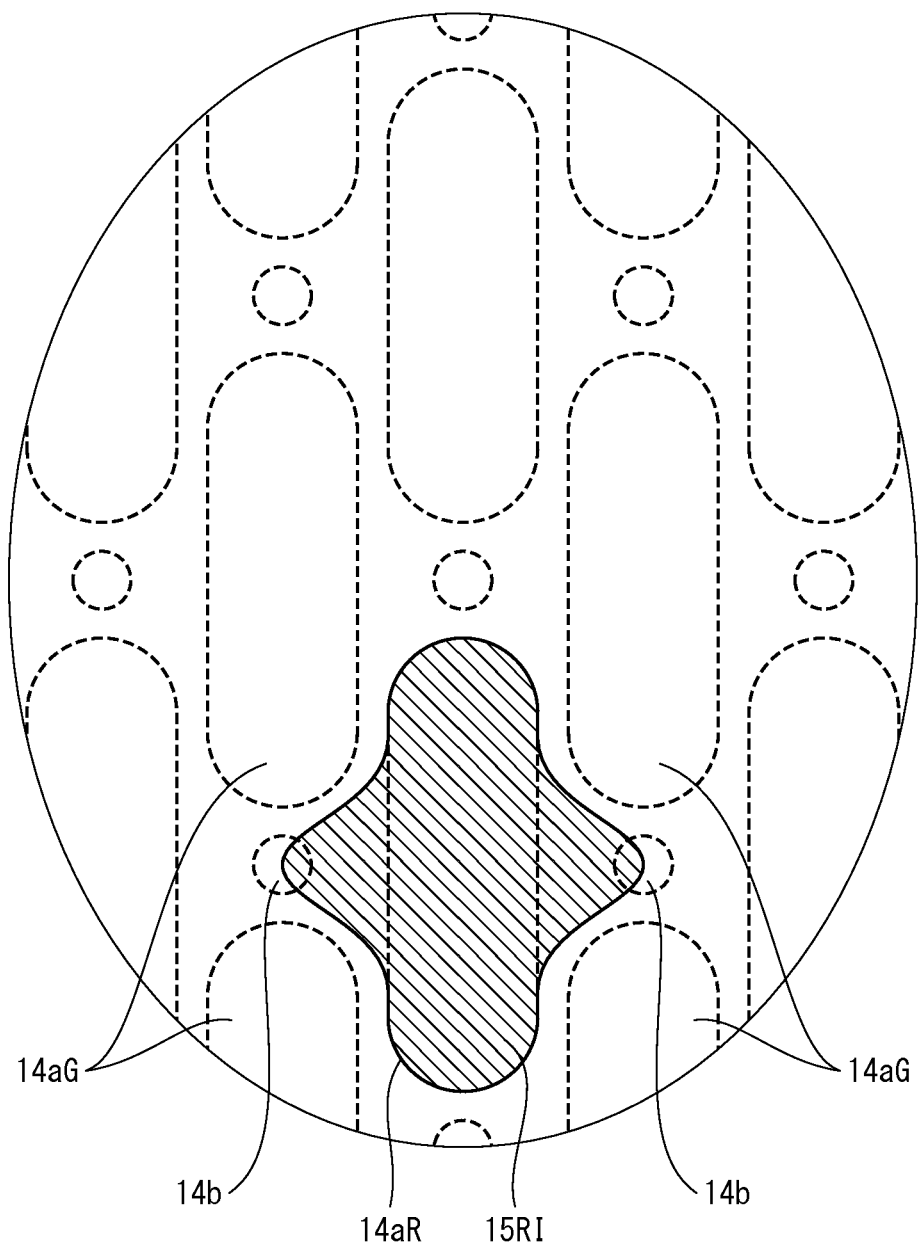
FIG. 10 is a schematic plan view diagram for describing a case in which organic material ink overflows during the process of manufacturing the organic EL display panel illustrated in FIG. 1.

The following is a description using FIGS. 7A-10 of effects due to the provision of the concave portions 14b in the bank layer 14. Note that in the present embodiment, light-emitting layers 15 that emit blue, red, and green light are referred to as a light-emitting layer 15B, a light-emitting layer 15R, and a light-emitting layer 15G, respectively. Further, organic material inks 15I that emit blue, red, and green light are referred to as organic material ink 15BI, organic material ink 15RI, and organic material ink 15GI. Note that, throughout the drawings, B, R, and G organic material ink is sequentially applied and dried color by color to illustrate a process of forming the light-emitting layers 15. FIGS. 7A, 7B, and 7C are schematic cross-sectional views and FIG. 8 is a schematic plan view, describing a process of manufacturing the organic EL display panel pertaining to a comparative example of a case in which red organic material ink overflows. On the other hand, FIGS. 9A, 9B, and 9C are schematic cross-sectional views and FIG. 10 is a schematic plan view, describing a process of manufacturing the organic EL display panel 1 in a case in which red organic material ink overflows.

3-1. Comparative Example

The following illustrates a process of forming a light-emitting layer in a process of manufacturing an organic material panel pertaining to a comparative example.

As illustrated in FIG. 7A, an organic material ink 915RI is applied to a sub-pixel region 914aR formed in a bank layer 914.

As illustrated in FIG. 7B, the organic material ink 915RI that overflows from the sub-pixel region 914aR flows onto the bank layer 914. A plan view at this time corresponds to FIG. 8.

Subsequently, when the organic material ink 915RI is dried, as illustrated in FIG. 7C, a light-emitting layer 915R is formed in the sub-pixel region 914aR into which the organic material ink 915RI is applied. Further, light-emitting layers 915R2 are fonned in sub-pixel regions 914aG adjacent to the sub-pixel region 914aR. The light-emitting layers 915R2 are formed by drying the organic material ink 915RI that overflows from the sub-pixel region 914aR.

In this way, in the organic EL display panel in the comparative example, light-emitting layers are also formed in sub-pixel regions adjacent to a target sub-pixel region, and therefore color mixing occurs in adjacent sub-pixel regions.

3-2. Working Example

The following illustrates a process of forming a light-emitting layer in a process of manufacturing an organic material panel pertaining to a working example.

As illustrated in FIG. 9A, organic material ink 15RI is applied to a sub-pixel region 14aR formed in the bank layer 14.

As illustrated in FIG. 9B, the organic material ink 15RI that overflows from the sub-pixel region 14aR flows onto the bank layer 14. Further, a portion of the organic material ink 15RI on the bank layer 14 enters the concave portions 14b formed in the bank layer 14. A plan view at this time corresponds to FIG. 10.

As a result, as illustrated in FIG. 9C, the organic material ink 15RI that overflows from the sub-pixel region 14aR does not enter the adjacent sub-pixel regions 14aG and instead enters the concave portions 14b formed in the bank layer 14.

In this way, in the organic EL display panel 1 of the working example, formation of light-emitting layers in the sub-pixel regions 14aG adjacent to the sub-pixel region 14aR is suppressed because the concave portions 14b are formed in the bank layer 14.

3-3. Effects

In such a structure, a minimum distance between the reference point 14P1 and an edge of an opening of a concave portion 14b among the concave portions 14b is less than a minimum distance between an edge of the first sub-pixel region and an edge of the second sub-pixel region. Thus, as illustrated in FIG. 3, the minimum distance between the reference point 14P1 and the edge of the opening of the concave portion 14b among the concave portions 14b is less than the minimum distance between the edge of the first sub-pixel region and the edge of the second sub-pixel region. Thus, organic material ink that overflows from the reference point 14P1 of the first sub-pixel region arrives at the concave portion 14b before arriving at the second sub-pixel region. Accordingly, even when the organic material ink overflows, entry of the organic material ink into adjacent sub-pixel regions is suppressed.

<Embodiment 2>

Embodiment 2 of the present invention differs from embodiment 1 in that concave portions of a bank layer are formed in contact holes allowing connection between anodes and an SD electrode. Accordingly, description of structure that is the same as in embodiment 1 is omitted here.

1. Structure

Figure 11:
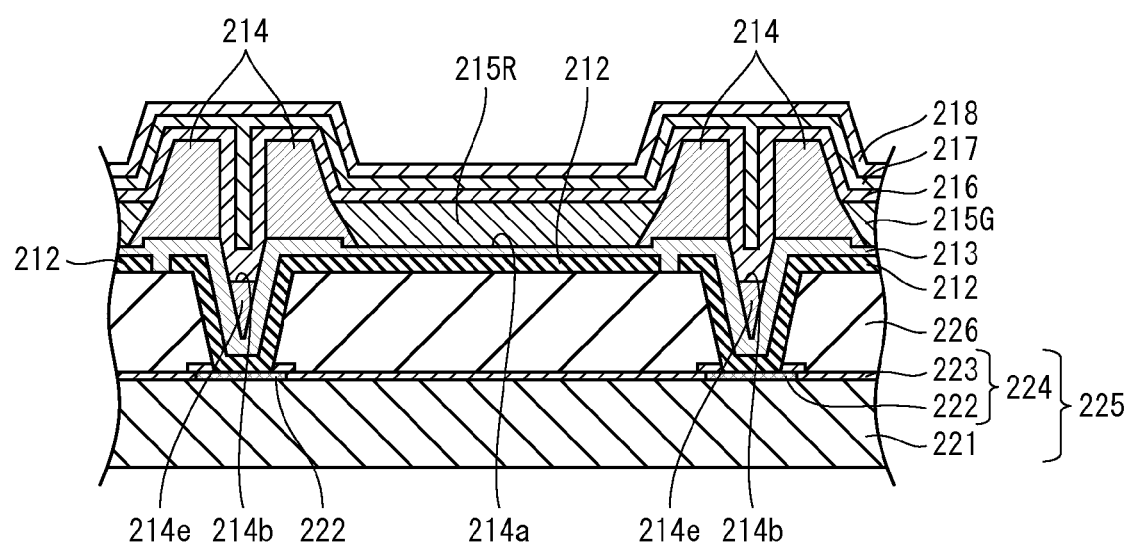
FIG. 11 is a cross-section of an organic EL display panel pertaining to embodiment 2.

As illustrated in the cross-section FIG. 11, the organic EL display panel 201 includes a glass substrate 221, a thin-film transistor (TFT) substrate 225 including a TFT 224, an interlayer insulating layer 226 on the TFT substrate 225, a plurality of anodes 212 on the interlayer insulating layer 226, one for each sub-pixel region, and a hole injection layer 213 on the anodes 212.

The TFT 224 is composed of a plurality of drains 222 that include an electrode and a semiconductor layer (not illustrated), a passivation layer 223, etc. Contact holes that allow connection between the anodes 212 and the TFT 224 are provided corresponding one-for-one with each drain of the drains 222 in the TFT 224. The contact holes are also in communication with the passivation layer 223. Thus, in the contact holes, the drains 222 are exposed at the bottom of the interlayer insulating layer 226. The anodes 212 are fonned along inner walls of the contact holes, and are connected to the drains 222 of the TFT 224.

Further, the organic EL display panel 201 includes a bank layer 214 provided with sub-pixel regions 214a and concave portions 214b, light-emitting layers 215 formed in the sub-pixel regions 214a, an electron injection layer 216 covering the bank layer 214 and the light-emitting layers 215, a cathode 217, and a sealing layer 218. At bottoms of the concave portions 214b, bottom portions 214e of the bank layer 214 remain. Further, above the bottom portions 214e of the bank layer 214, the electron injection layer 216, the cathode 217, and the sealing layer 218 are layered in the stated order within the concave portions 214b of the bank layer 214.

2. Effects

In this structure, the concave portions 214b of the bank layer 214 are formed in the contact holes. In this way, positioning of the concave portions 214b when forming the bank layer 214 is not required, and manufacturing is simplified.

Further, at the bottoms of the concave portions 214b, the bottom portions 214e of the bank layer 214 remain. Thus, even when the organic material ink enters the concave portions 214 and functional layers are formed, the functional layers in the concave portions 214 do not emit light and color mixing between adjacent sub-pixel regions is suppressed.

<Embodiment 3>

Embodiment 3 of the present invention differs from embodiment 2 in that an insulating layer is formed between the anodes and the bottoms of the concave portions of the bank layer. Accordingly, description of structure that is the same as in embodiment 1 and/or 2 is omitted here.

1. Structure

Figure 12:
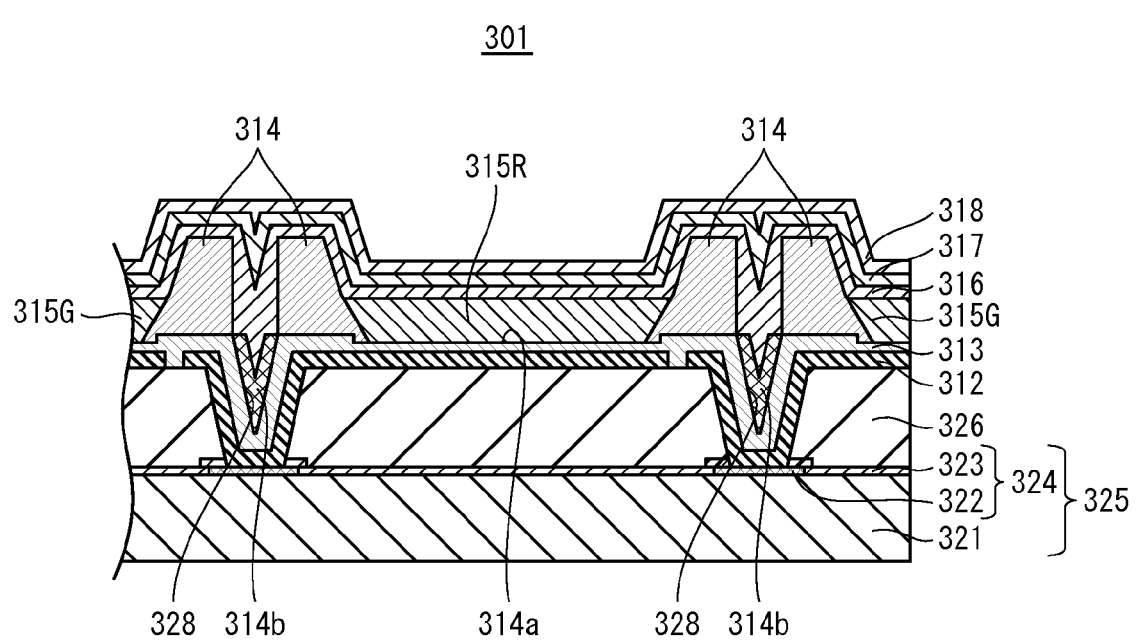
FIG. 12 is a cross-section of an organic EL display panel pertaining to embodiment 3.

As illustrated in FIG. 12, an organic EL display panel 301 includes a TFT substrate 325, an interlayer insulating layer 326 formed on the TFT substrate 325, a plurality of anodes 312 on the interlayer insulating layer 326, one for each sub-pixel region, and a hole injection layer 313 formed on the anodes 312. As in embodiment 2, contact holes allowing connection between the anodes 312 and the TFT 324 are also in connection with a passivation layer 323. A plurality of drains 322 are exposed in the contact holes at a bottom portion of the interlayer insulating layer 326. The anodes 312 are formed along inner walls of the contact holes, and are connected to the drains 322 of the TFT 324.

Further, the organic EL display panel 301 includes a bank layer 314 provided with sub-pixel regions 314a and concave portions 314b, light-emitting layers 315 formed in the sub-pixel regions 314a, an electron injection layer 316 covering the bank layer 314 and the light-emitting layers 315, a cathode 317, and a sealing layer 318. Insulating layers 328 are formed at bottoms of the concave portions 314b. Further, above the insulating layers 328, the electron injection layer 316, the cathode 317, and the sealing layer 318 are layered in the stated order within the concave portions 314b of the bank layer 314.

2. Effects

In this structure, the insulating layers 328 are formed at the bottoms of the concave portions 314b of the bank layer 314. Thus, even when the organic material ink enters the concave portions 314b and functional layers are formed, the functional layers in the concave portions 314b do not emit light and color mixing between adjacent sub-pixel regions is suppressed.

<Modifications>

Description above is based on embodiments of the present invention, but the present invention is not limited to the above embodiments. The following describes modifications of the above embodiments.

1. Ink Outflow Portion

In the above embodiments, examples are provided in which banks of a bank layer are of uniform width and the organic material ink easily overflows from a central portion of an edge of the sub-pixel region. However, the present invention is not limited in this way, and the banks of the bank layer need not be of uniform width. When the banks of the bank layer are not of uniform width, the organic material ink overflows from a narrower portion of the banks and easily enters adjacent sub-pixel regions. Thus, when the banks of the bank layer are not of uniform width, the sub-pixel regions and the concave portions are arranged such that a minimum distance between an ink outflow portion that is a narrow portion of the banks of the bank layer and an edge of an opening of a concave portion provided in the bank layer is shorter than a minimum distance between the ink outflow portion and an edge of an adjacent sub-pixel region.

2. Characteristics of Organic Material Ink (Surface Tension)

Surface tension of the organic material ink is preferably 20 mN/m to 70 mN/m and more preferably 25 mN/m to 45 mN/m. By having the surface tension within such a range, flight deflection of droplets of the organic material ink is suppressed when ink is discharged from a nozzle of an inkjet device during ink application. Specifically, when the surface tension of the organic material ink is less than 20 nM/m, wettability of the organic material ink on a nozzle surface is increases, and when the organic material ink is discharged the organic material ink may attach asymmetrically around a nozzle hole. In such a case, an attractive force acts between the organic material ink attached to the nozzle hole and attached material that is to be discharged, and therefore the organic material ink is discharged with non-uniform force, and flight deflection causing a target location to not be reached increases in frequency. Further, when the surface tension of the organic material ink is greater than 70 nM/m, shape of droplets at a tip of the nozzle are not stable, and therefore control of discharge size and discharge timing of the organic material ink becomes difficult.

(Concentration of Solids)

Solid content concentration of the organic material ink is preferably 0.01 wt % to 10.0 wt % and more preferably 0.1 wt % to 5.0 wt % with respect to overall composition. When solid content concentration is too low, a number of discharges to achieve a required layer thickness becomes great, and efficiency of manufacture is reduced. Further, when solid content concentration is too high, discharge properties are affected.

(Solvent)

The organic material in layers having light-emitting functions used in the present invention, such as the light-emitting layers, the hole injection layer, etc., are typically dissolved in organic solvent and applied in a form of organic material ink. Selection of solvent for the organic material is performed taking into consideration solubility and stability of the organic material, viscosity and surface tension of important organic material inks when forming the light-emitting layers, boiling point of a solvent required to ensure uniformity of the light-emitting layers, etc.

As the solvent of the organic material ink, a solvent may be used from solvents having a relatively low boiling point such as toluene, xylene, etc., to solvents having a boiling point greater than 300° C., such as dodecylbenzene. Further, while one of such solvents may be used, using a mix of such solvents is preferable.

Here, when using a mix of a solvent having a relatively low boiling point and a solvent having a high boiling point, flatness of the light-emitting layers during solvent drying is increased. For example, when a mix of a solvent having a boiling point of 100° C. to 200° C. and a solvent having a boiling point 250° C. to 350° C. is used, light-emitting layers of excellent flatness are achieved by inkjet and nozzle coating methods.

3. Methods of Drying Organic Material Ink

As a method of drying the organic material ink, aside from vacuum drying and baking, drying in an inert gas may be used, and drying in an environment to some extent containing the solvent of the organic material ink may also be used.

4. Layer Structure

In the above embodiments, the layer structure is of a top-emission type. In the case of a top-emission type, anodes that reflect light are preferable, and a cathode that is substantially light-transmissive is preferable. Here, the anodes and the cathode are typically multi-layer structures. However, the present invention is not limited in this way, and may be of a bottom-emission type in which light from the light-emitting layers is emitted from the glass substrate side. Further, the electrode nearer the substrate may be the cathode, in a so-called reverse structure. In the reverse structure, effects of the present invention can be expected in both bottom-emission and top-emission types of structure.

5. Light-Emitting Layers

In the above embodiments, organic semiconductor material is applied on the hole injection layer to form the light-emitting layers. Further, the electron injection layer is formed between the light-emitting layers and the cathode. However, the present invention is not limited to this structure, and when an IL layer is provided between the light-emitting layers and the hole injection layer as a hole blocking layer, light-emitting efficiency is improved. As the hole blocking layer, a polyfluorene type of polymer material having a higher lowest unoccupied molecular orbital (LUMO) level than the material used in the light-emitting layers may be used, and TFB having a low electron mobility may be used, however, the present invention is not limited to these examples. As the light-emitting layers, polyfluorene, polyphenyline vinylene, pendant, dendrimer, application, and low-molecular-weight types may be used, as long as they can be dissolved in solvent, applied, and formed into a layer.

Multiple types of material having light-emitting functions may be included in the light-emitting layers, mobility and injection characteristics of holes and electrons may be adjusted, and light-emission chromaticity may be adjusted. Further, when using light-emitting material as a dopant, an application liquid may be obtained by mixing the dopant with a host material. As a dopant, known fluorescent light-emitting material and phosphorescent material may be used. Such material may be small molecules, polymers, oligomers, etc. Further, combinations of types may be used, such as by adding a small molecule dopant to a polymeric host material.

6. Bank Layer

In the above embodiments and modifications, an upper surface of the bank layer is flat. However, the present invention is not limited in this way, and the upper surface of the bank layer may be slanted to be a lower height approaching the concave portions. In this way, when the organic material ink overflows from the sub-pixel regions onto the bank layer, the organic material ink is rapidly moved to the concave portions.

Further, thickness of the bank layer may vary greatly depending on the concentration of solids of the organic material ink that is printed, but a thickness of 100 nm or greater is preferable. Further, any material may be used as the material of the bank layer in the above embodiments as long as the material has electrical insulating properties. An electrically insulating resin having heat resistance and resistance to the solvent is preferable (for example, a polyimide resin). Additionally, it is preferable that the organic material constituting the bank layer contains a component having liquid repellency with respect to the organic material ink, the component having a function of preventing overflow of the organic material ink when printing into the banks is performed using inkjets, etc. As a method of forming the bank layer, photolithographic techniques, etc., are used, and the banks are formed by patterning. For example, after applying the bank layer material, a desired shape is formed on the hole injection layer by a baking process, a mask exposure process, a developing process, etc. Further, in the above embodiments, the banks of the bank layer are tapered in cross-section and such a shape is preferable from a perspective of preventing ink overflow and confirming a formation state of the light-emitting layers. However, the present invention is not limited in this way.

7. Hole Injection Layer

The hole injection layer is a functional material, and may be a polythiophene such as poly(3,4-ethylenedioxythiophene) (PEDOT) formed by any one of a spin coating method, an inkjet method, and a nozzle coating method. A polyaniline material may also be used as the hole injection layer. Further, inorganic hole injection layers are also known, and molybdenum oxide, tungsten oxide, vanadium oxide, ruthenium oxide, etc., may be used. Alternatively, as the hole injection layer, a carbon compound such as fullerene may be used via vapor deposition, and formed by any one of vacuum deposition, electron beam deposition, and sputtering.

Thickness of the hole injection layer is preferably 5 nm to 200 nm. Further, as the hole injection layer, molybdenum oxide, tungsten oxide, carbon compounds such as fullerene, etc., may be used and a layer formed by vapor deposition or sputtering. Oxides of transition metals are preferable as they have a high ionization potential, easily inject holes into light-emitting material, and are also excellent for stability. Such oxides, when made to have a defect level during formation or after formation, are effective in enhancing hole injection properties of the hole injection layer.

8. Cathode

As the cathode, a metal or alloy having a small work function is used. In a top-emission structure in the present embodiments, an ultrathin layer is formed having a high light-transmission property using a metal having a small work function, and a conducting layer composed of a light-transmissive material such as ITO or IZO is layered on the ultrathin layer to form a light-transmissive cathode. The ultrathin film having a small work function is not limited to a two-layer structure of Ba—Al, and may use any one of a two-layer Ca—Al structure, a metal such as Li, Ce, Ca, Ba, In, Mg, Ti, etc., an oxide thereof, a halide such as fluoride, a Mg alloy such as a Mg—Ag, Mg—In, etc., and an Al alloy such as Al—Li, Al—Sr, Al—Ba, etc. Alternatively, an ultrathin layered structure such as $LiO_2/Al$, $LiF/Al$ and a light-transmissive conductive layer is suitable as a cathode material. Further, a transition metal oxide having oxygen deficiency and indicating conductivity such as TiOx, MoOx, WOx, TiOx, ZnO, etc., may be used as an electron injection layer.

9. Product Form

The organic EL display panel of the above embodiments can be distributed directly to sales channels as an independent device. However, the present invention is not limited in this way, and may be distributed combined with a display device such as a digital television.

INDUSTRIAL APPLICABILITY

The present invention, in the industry of organic EL display panels using organic EL elements manufactured by an inkjet device, suppresses color mixing and has high versatility and applicability in fields such as electronic devices and displays.

REFERENCE SIGNS LIST

1, 201, 301 organic EL display panel
3 drive circuit
5 control circuit
11 TFT substrate
12 anode
13 hole injection layer
14 Bank Layer
14a sub-pixel regions
14b concave portions
15 light-emitting layers
15RI organic material ink
16 electron injection layer
17 cathode
18 sealing layer

The invention claimed is:

1. An organic electroluminescence (EL) display panel, comprising:
   a substrate; and
   a bank layer on the substrate, the bank layer defining a plurality of first sub-pixel regions that each have an elongated shape and a plurality of second sub-pixel regions that each have an elongated shape and a light-emission color different from a light-emission color of the first sub-pixel regions, the bank layer having an upper portion in which a plurality of concave portions is provided, wherein
   the concave portions are directly above contact holes, the contact holes providing electrical connections between light-emitting portions and a drive element for driving the light-emitting portions, the light-emitting portions being in the first sub-pixel regions and the second sub-pixel regions, and an electrical insulator being between the concave portions and the contact holes, and in a plan view of the substrate,
the first sub-pixel regions are arranged in a first column,
the second sub-pixel regions are arranged in a second column,
the second column is adjacent to the first column in a direction other than a longitudinal direction of the first sub-pixel regions,
each center point in a longitudinal direction of the second sub-pixel regions is not located on a straight line in a lateral direction from each center point in the longitudinal direction of the first sub-pixel regions, the lateral direction being perpendicular to the longitudinal direction of the first sub-pixel regions,
the upper portion of the bank layer between the first column and the second column is flat,
when an imaginary line is drawn in the lateral direction from a center point in the longitudinal direction of at least one of the first sub-pixel regions, and when, of two intersection points where the imaginary line and an edge of the at least one of the first sub-pixel regions intersect, an intersection point closest to one of the concave portions provided in the bank layer is defined as a reference point,
a minimum distance between the reference point of the first sub-pixel regions and an edge of one of the concave portions between two of the second sub-pixel regions closest to the reference point is shorter than a minimum distance between the reference point and an edge of one of the second sub-pixel regions closest to the reference point,
the one of the concave portions closest to the reference point is between two of the second sub-pixel regions in the longitudinal direction of the second sub-pixel regions, and
another of the concave portions is between two of the first sub-pixel regions in the longitudinal direction of the first sub-pixel regions.

2. The organic EL display panel of claim 1, wherein
the longitudinal direction of the second sub-pixel regions is parallel to the longitudinal direction of the first sub-pixel regions.

3. The organic EL display panel of claim 2, wherein
an upper surface of the upper portion of the bank layer around the concave portions is inclined toward the concave portions so that a height of the upper surface decreases toward the concave portions.

4. The organic EL display panel of claim 1, wherein
the bank layer further defines a plurality of third sub-pixel regions opposite the second sub-pixel regions relative to the first sub-pixel regions, the third sub-pixel regions each having an elongated shape and having a light-emission color different from the light-emission color of the first sub-pixel regions and the light-emission color of the second sub-pixel regions,
a longitudinal direction of the third sub-pixel regions is parallel to the longitudinal direction of the first sub-pixel regions and the third sub-pixel regions are adjacent to the first sub-pixel regions in a direction other than the longitudinal direction of the first sub-pixel regions, and
in the plan view of the substrate, a distance between a second intersection point of the two intersection points that is not the reference point and an edge of a concave portion closest to the second intersection point is shorter than a distance between the second intersection point and an edge of one of the third sub-pixel regions closest to the second intersection point.

5. The organic EL display panel of claim 4, wherein
an organic layer is formed by applying and drying an ink containing organic material into the first sub-pixel regions, the second sub-pixel regions, and the third sub-pixel regions.

6. The organic EL display panel of claim 5, wherein
the organic layer is an organic light-emitting layer.

7. The organic EL display panel of claim 4, wherein
an end portion of an edge of one of the second sub-pixel regions and an end portion of an edge of one of the third sub-pixel regions are aligned in the lateral direction.

8. The organic EL display panel of claim 1, wherein
each of the concave portions is a through-hole in the bank layer.

9. The organic EL display panel of claim 1, wherein
a width of the bank layer in at least one of the first column and the second column in the lateral direction is non-uniform.

10. The organic EL display panel of claim 1, wherein
a minimum distance between the one of the concave portions closest to the reference point and the one of the second sub-pixel regions closest to the reference point is shorter than the minimum distance between the reference point and the edge of the one of the concave portions closest to the reference point.

11. The organic EL display panel of claim 1, further comprising:
an insulation layer provided on the concave portions of the bank layer.

12. The organic EL display panel of claim 1, wherein
the electrical insulator is a portion of the bank layer.

13. The organic EL display panel of claim 1, wherein
in the upper portion of the bank layer, none of the concave portions is present on a line along the minimum distance from the reference point to the edge of the one of the second sub-pixel regions closest to the reference point.

14. An organic electroluminescence (EL) display panel, comprising:
a plurality of first sub-pixel regions each having an elongated shape and arranged in a first column;
a plurality of second sub-pixel regions each having an elongated shape and arranged in a second column, the second column being adjacent to the first column in a direction other than a longitudinal direction of the first sub-pixel regions and having a light-emission color different to a light-emission color of the first sub-pixel regions; and
a bank layer in which concave portions are provided other than the first sub-pixel regions and the second sub-pixel regions, wherein
the concave portions are directly above contact holes, the contact holes providing electrical connections between light-emitting portions and a drive element for driving the light-emitting portions, the light-emitting portions being in the first sub-pixel regions and the second sub-pixel regions, and an electrical insulator being between the concave portions and the contact holes, and
in a plan view of the substrate,
each center point in a longitudinal direction of the second sub-pixel regions is not located on a straight line in a lateral direction from each center point in the longitudinal direction of the first sub-pixel regions, the lateral direction being perpendicular to the longitudinal direction of the first sub-pixel regions, the upper portion of the bank layer between the first column and the second column is flat, an edge of one of the first sub-pixel regions includes an ink outflow portion, a minimum distance between the ink outflow portion of the first sub-pixel regions and an edge of one of the concave portions between two of the second sub-pixel regions closest to the ink outflow portion is shorter than a minimum distance between the ink outflow portion and one of the second sub-pixel regions, the one of the concave portions closest to the ink outflow portion is between two of the second sub-pixel regions in the longitudinal direction of the second sub-pixel regions, and another of the concave portions is between two of the first sub-pixel regions in the longitudinal direction of the first sub-pixel regions.

15. A method of manufacturing an organic electroluminescence (EL) display panel, the method comprising:

preparing a substrate; and forming a bank layer on the substrate, the bank layer defining a plurality of first sub-pixel regions that each have an elongated shape and a plurality of second sub-pixel regions that each have an elongated shape, the bank layer having an upper portion in which a plurality of concave portions is provided, wherein the concave portions are directly above contact holes, the contact holes providing electrical connections between light-emitting portions and a drive element for driving the light-emitting portions, the light-emitting portions being in the first sub-pixel regions and the second sub-pixel regions, and an electrical insulator being between the concave portions and the contact holes, and in a plan view of the substrate, the first sub-pixel regions are arranged in a first column, the second sub-pixel regions are arranged in a second column, the second column is adjacent to the first column in a direction other than a longitudinal direction of the first sub-pixel regions, each center point in a longitudinal direction of the second sub-pixel regions is not located on a straight line in a lateral direction from each center point in the longitudinal direction of the first sub-pixel regions, the lateral direction being perpendicular to the longitudinal direction of the first sub-pixel regions, the upper portion of the bank layer between the first column and the second column is flat, when an imaginary line is drawn in the lateral direction from a center point in the longitudinal direction of at least one of the first sub-pixel regions, and when, of two intersection points where the imaginary line and an edge of the at least one of the first sub-pixel regions intersect, an intersection point closest to one of the concave portions is defined as a reference point, in forming the bank layer, the concave portions are formed such that a minimum distance between the reference point of the first sub-pixel regions and an edge of the one of the concave portions between two of the second sub-pixel regions closest to the reference point is formed to be shorter than a minimum distance between the reference point and an edge of one of the second sub-pixel regions closest to the reference point, the one of the concave portions closest to the reference point is between two of the second sub-pixel regions in the longitudinal direction of the second sub-pixel regions, and another of the concave portions is between two of the first sub-pixel regions in the longitudinal direction of the first sub-pixel regions.

* * * * *